(12) United States Patent
Chiu et al.

(10) Patent No.: US 8,154,347 B2
(45) Date of Patent: Apr. 10, 2012

(54) AUDIO PROCESSING CIRCUIT AND PREAMPLIFIER CIRCUIT

(75) Inventors: Jui-Te Chiu, Hsinchu (TW); Li-Te Wu, Taipei (TW)

(73) Assignee: Fortemedia, Inc., Sunnyvale, CA (US)

( * ) Notice: Subject to any disclaimer, the term of this patent is extended or adjusted under 35 U.S.C. 154(b) by 541 days.

(21) Appl. No.: 12/489,695

(22) Filed: Jun. 23, 2009

(65) Prior Publication Data

US 2010/0322440 A1 Dec. 23, 2010

(51) Int. Cl.
*H03F 3/04* (2006.01)
(52) U.S. Cl. .................................. 330/301; 330/117
(58) Field of Classification Search .................. 330/301, 330/117
See application file for complete search history.

(56) References Cited

U.S. PATENT DOCUMENTS

| 5,384,501 A * | 1/1995 | Koyama et al. ............... 327/336 |
| 7,760,028 B2 * | 7/2010 | Sanduleanu et al. .......... 330/301 |
| 2006/0044068 A1 * | 3/2006 | Alenin .......................... 330/301 |
| 2008/0252381 A1 * | 10/2008 | Sanduleanu et al. .......... 330/301 |

* cited by examiner

*Primary Examiner* — Henry Choe
(74) *Attorney, Agent, or Firm* — Thomas|Kayden

(57) ABSTRACT

An audio processing circuit is provided, receiving a microphone signal from a microphone to output a differential signal. A preamplifier receives the microphone signal to output a first preamplified voltage and a second preamplified voltage. A gain stage receives the first preamplified voltage and the second preamplified voltage to output the differential signal comprising a first differential output and a second differential output. In the preamplifier, a first operational amplifier is provided. A first voltage controlled current source is controlled by the output end of the first operational amplifier to provide a first current. A first transistor has a gate coupled to a ground voltage supply, a source coupled to the first voltage controlled current source for receiving the first current, and a drain coupled to a voltage ground. Likewise, a second voltage controlled current source and a second transistor are presented symmetrically to render the differential output.

11 Claims, 3 Drawing Sheets

110

AUDIO PROCESSING CIRCUIT AND PREAMPLIFIER CIRCUIT

BACKGROUND OF THE INVENTION

1. Field of the Invention

The invention relates to a microphone preamplifier, and in particular, to a low noise design that reduces interferences caused by thermal noise and flicker noise.

2. Description of the Related Art

A typical microphone has a capacitor for sensing the sound pressure. As the capacitance of the capacitor varies in proportional to the sound pressure, the sound is thereby converted to a voltage signal. To maintain sensibility of the microphone, it is important not to load the microphone capacitance with a resistive load, because a resistive load will discharge the capacitor and thereby ruin the linear dependency of the sound pressure.

A preamplifier is therefore required to resolve the consequences. The preamplifier is generally configured with a high input resistance, transforming the output voltage from the microphone to post stages without loss of the sensibility. The preamplifier is typically connected physically very close to the capacitor, within a distance of very few millimeters or fractions of millimeters.

Conventionally, a preamplifier comprises at least two operational amplifiers and a plurality of resistors to generate a differential outputs based on a single ended microphone input signal. Thermal noise and flicker noise are unavoidably generated from those components, affecting the signal quality of the differential outputs. As the modern technology develops, requirement for compact size and power efficiency also increase rapidly. The conventional preamplifier turns out to be inadequate because it consumes significant power to suppress the undesirable noises. It is therefore desirable to propose an improved architecture of a microphone preamplifier.

BRIEF SUMMARY OF THE INVENTION

An exemplary embodiment of an audio processing circuit is provided, receiving a microphone signal from a microphone to output a differential signal. In the audio processing circuit, a preamplifier receives the microphone signal to output a first preamplified voltage and a second preamplified voltage. A gain stage receives the first preamplified voltage and the second preamplified voltage to output the differential signal comprising a first differential output and a second differential output. In the preamplifier, a first operational amplifier is provided. A first voltage controlled current source is controlled by the output end of the first operational amplifier to provide a first current. A first transistor has a gate coupled to a ground voltage supply, a source coupled to the first voltage controlled current source for receiving the first current, and a drain coupled to a voltage ground. Likewise, a second voltage controlled current source is controlled by the output end of the first operational amplifier to provide a second current. A second transistor has a gate for receiving the microphone signal, a source coupled to the second voltage controlled current source for receiving the second current, and a drain coupled to the voltage ground. The second input end of the first operational amplifier is connected to the drain of the second transistor. The source of the first transistor is a first output end for outputting the first preamplified voltage. The source of the second transistor is a second output end for outputting the second preamplified voltage.

In the preamplifier, a first resistor is coupled between the drain of the first transistor and the voltage ground, and a second resistor is coupled between the drain of the second transistor and the voltage ground. The reference voltage may be 0.3 volt. The first transistor and the second transistor may be P-type Metal-Oxide-Semiconductor field effect transistors (P-MOSFETs) of identical parameters.

In the gain stage, a second operational amplifier has a positive input end coupled to the first preamplified voltage, a negative input end coupled to the second preamplified voltage, a positive power supply end for outputting the first differential output, and a negative power supply end for outputting the second differential output. A first capacitor and a third resistor are coupled in parallel between the negative input end and the positive power supply end, and a second capacitor and a fourth resistor are coupled in parallel between the positive input end and the negative power supply end. Resistances of the third resistor and fourth resistor may be at least 10 giga ohm.

The gain stage may further comprise a third capacitor coupled between the negative input end and the source of the second transistor, and a fourth capacitor, coupled between the positive input end and the source of the first transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
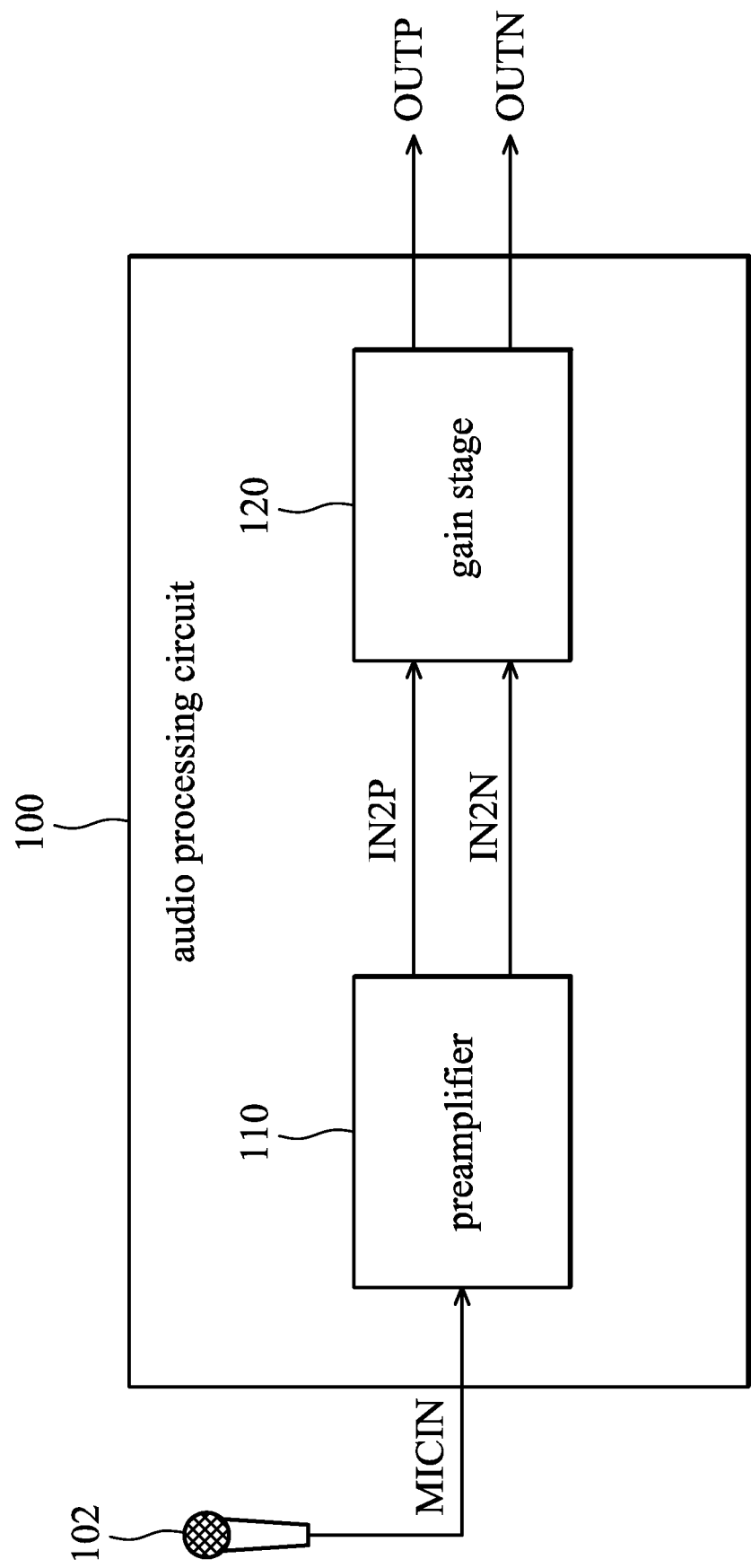
FIG. 1 shows an embodiment of a circuit for processing microphone signals.

FIG. 1 shows an embodiment of an audio processing circuit 100 for processing microphone signals. The audio processing circuit 100 is preferably implemented in a chip (not shown) that may further comprise essential components such as a low pass filter (LPF), an analog to digital converter (ADC) and a digital signal processor. A microphone signal MICIN is sent from a microphone 102 to the audio processing circuit 100, and through a preamplifier 110 and a gain stage 120 in the audio processing circuit 100, a differential signal comprising a first differential output OUTN and a second differential output OUTP is output therefrom.

Figure 2:
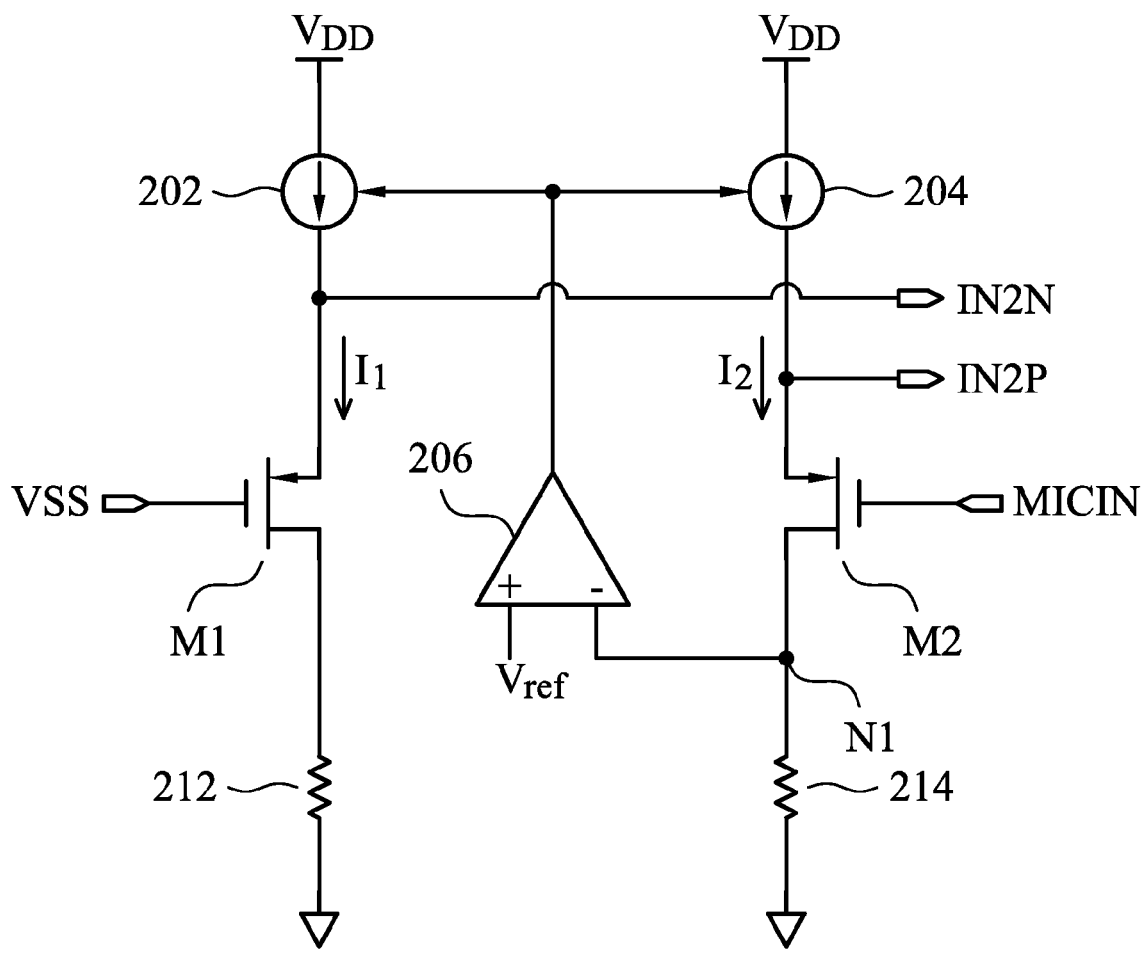
FIG. 2 shows an embodiment of a preamplifier according to FIG. 1.

FIG. 2 shows an embodiment of the gain stage 120. An operational amplifier 206 is provided, having a positive input end coupled to a reference voltage Vref, and a second input end coupled to a node N1. A first voltage controlled current source 202 and a second voltage controlled current source 204 are presented, powered by a supply voltage VDD. The output end of the operational amplifier 206 provides a voltage to control the first voltage controlled current source 202 and the second voltage controlled current source, such that the first voltage controlled current source 202 and second voltage controlled current source generate a first current I1 and a second current I2, respectively. The first voltage controlled current source 202 and the second voltage controlled current source are preferably a matched pair, such that the first current I1 and the second current I2 are subsequently identical. A first transistor M1 is driven by the first current I1, having a gate coupled to a ground voltage supply VSS, a source coupled to the first voltage controlled current source 202, and a drain coupled to a voltage ground. The potential on the source of the first transistor M1 is output as the first preamplified voltage IN2N. Meanwhile, a second transistor M2 is driven by the second voltage controlled current source, having a gate for receiving the microphone signal MICIN, a source coupled to the second voltage controlled current source, and a drain coupled to the voltage ground. The potential on the source of the second transistor M2 is output as the second preamplified voltage IN2P.

In the embodiment, the node N1 where the negative input end of the operational amplifier 206 is connected, is actually the drain of the second transistor M2, thereby the operational amplifier 206 forms an open loop with a unity gain. Therefore, the second preamplified voltage IN2P has a gain identical to that of the microphone signal MICIN, and the first preamplified voltage IN2N has a gain subsequently identical to the ground supply voltage.

As shown in FIG. 2, a first resistor 212 is coupled between the drain of the first transistor MI and the voltage ground, and a second resistor 214 is coupled between the drain of the second transistor M2 and the voltage ground. In the embodiment, noise generated by the operational amplifier 206 will not affect the signal qualities of first preamplified voltage IN2N and second preamplified voltage IN2P because the differential architecture can inherently balance it. As a conventional preamplifier usually utilizes four to six resistors, the embodiment of audio processing circuit 100 is superior because it only utilizes two resistors first resistor 212 and second resistor 214. Although the first transistor M1, second transistor M2, first resistor 212 and second resistor 214 may still induce thermal noises, the influence is significant reduced in comparison to a conventional preamplifier.

The reference voltage Vref is an adjustable value that determines the range of the first preamplified voltage IN2N and second preamplified voltage IN2P. A preferable value is 0.3 volt in this embodiment. The first transistor M1 and the second transistor M2 are preferably P-type Metal-Oxide-Semiconductor field effect transistors (P-MOSFETs) of matched parameters, however, other type transistors may also be adaptable if proper modification is made.

Figure 3:
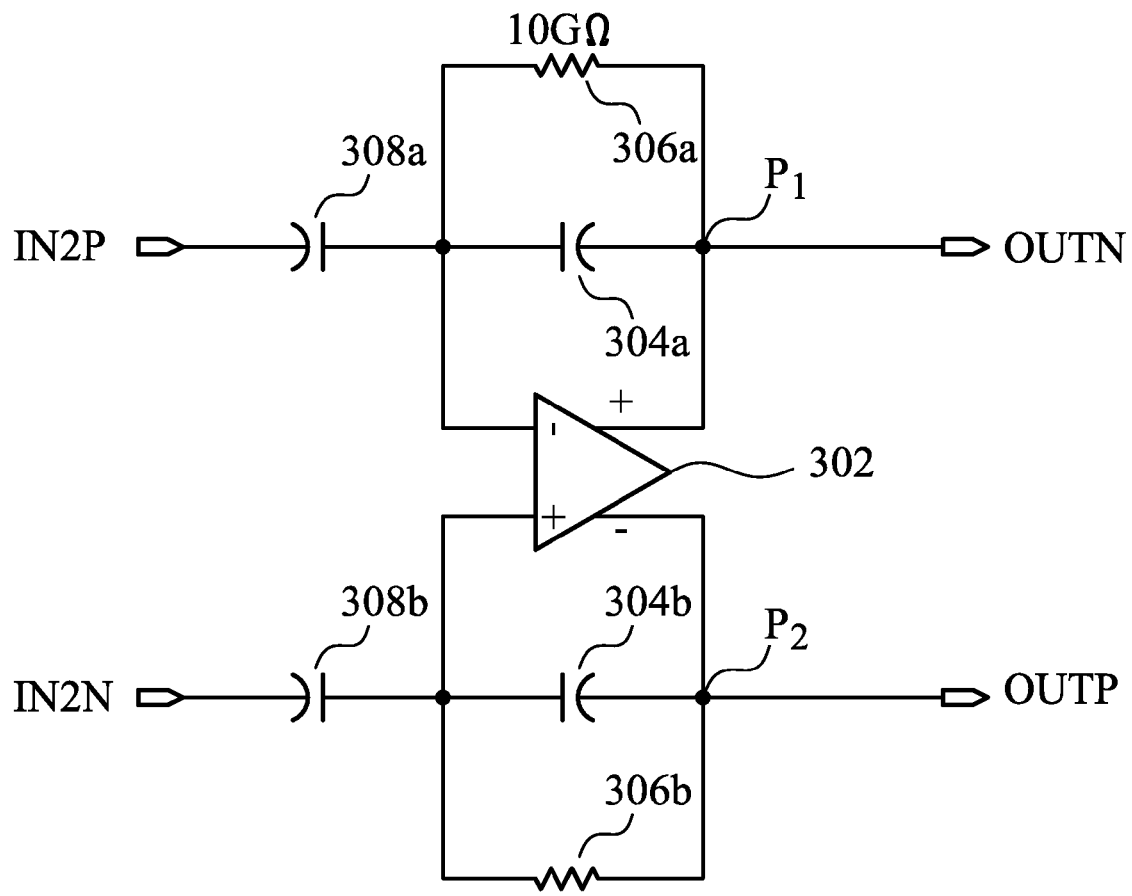
FIG. 3 shows an embodiment of a gain stage according to FIG. 1.

FIG. 3 shows an embodiment of the gain stage 120. The gain stage 120 is a charge transfer design that employs capacitors to replace conventional resistors, such that thermal noise can be reduced. In the gain stage 120, an operational amplifier 302 is employed. The operational amplifier 302 has a positive input end (+) coupled to the first preamplified voltage IN2N, a negative input end (−) coupled to the second preamplified voltage IN2P, a positive power supply end coupled to a node P1, and a negative power supply end coupled to a node P2. A first capacitor 304a and a third resistor 306a are cascaded in parallel between the negative input end and the node P1. Meanwhile, a second capacitor 304b and a fourth resistor 306b are cascaded in parallel between the positive input end and node P2.

As shown in FIG. 3, a third capacitor 308a is coupled between the negative input end and the source of the second transistor M2, and a fourth capacitor 308b is coupled between the positive input end and the source of the first transistor M1. When the first preamplified voltage IN2N and the second preamplified voltage IN2P are sent from the preamplifier 110, the first differential output OUTN is generated from the node P1, and the second differential output OUTP is generated from the P2, respectively. Since the usage of the capacitors reduces the usage of resistors, and capacitors do not generate thermal noise, the noise induced in the embodiment can be significantly reduced.

In FIG. 3, the third resistor 306a and fourth resistor 306b are adjustable. High values are preferable, such as 10 giga ohm or more. Through the audio processing circuit 100, the microphone signal MICIN can be efficiently transformed into quality differential signals. Although the detailed circuit inside the first voltage controlled current source 202, second voltage controlled current source, operational amplifiers 206 and 302 are not described, and they are known as usual components that can be easily implemented. The microphone 102 in FIG. 1 is not limited to be an analog microphone. A digital microphone may also be adaptable. The audio processing circuit 100 is particularly useful in mobile devices in which power consumption is strictly regulated. As a supplement embodiment, a buffer circuit (not shown) may further be implement between the preamplifier 110 and gain stage 120, for buffering the first preamplified voltage IN2N and the second preamplified voltage IN2P sent from the preamplifier 110 to the gain stage 120. The invention does not limit to any modification implemented based on the proposed architecture.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A preamplifier circuit for receiving a microphone signal from a microphone to output a differential signal, comprising:
   an operational amplifier, having a first input end coupled to a reference voltage, a second input end, and an output end;
   a first voltage controlled current source, controlled by the output end of the operational amplifier to provide a first current;
   a first transistor first transistor, having a gate coupled to a ground voltage supply, a source coupled to the first voltage controlled current source for receiving the first current, and a drain coupled to a voltage ground;
   a second voltage controlled current source, controlled by the output end of the operational amplifier to provide a second current;
   a second transistor, having a gate for receiving the microphone signal, a source coupled to the second voltage controlled current source for receiving the second current, and a drain coupled to the voltage ground; wherein:
   the second input end of the operational amplifier is connected to the drain of the second transistor;
   the source of the first transistor is a first output end for outputting a first preamplified voltage; and
   the source of the second transistor is a second output end for outputting a second preamplified voltage.

2. The preamplifier circuit as claimed in claim 1, further comprising:
   a first resistor, coupled between the drain of the first transistor and the voltage ground; and
   a second resistor, coupled between the drain of the second transistor and the voltage ground.

3. The preamplifier circuit as claimed in claim 1, wherein the reference voltage is 0.3 volt.

4. The preamplifier circuit as claimed in claim 1, wherein the first transistor and the second transistor are P-type Metal-Oxide-Semiconductor field effect transistors (P-MOSFETs).

5. An audio processing circuit for receiving a microphone signal from a microphone to output a differential signal, comprising:
   a preamplifier, receiving the microphone signal to output a first preamplified voltage and a second preamplified voltage; and
   a gain stage, coupled to the preamplifier, receiving the first preamplified voltage and the second preamplified voltage to output the differential signal comprising a first differential output and a second differential output, wherein the preamplifier comprises:
      a first operational amplifier, having a first input end coupled to a reference voltage, a second input end, and an output end;
      a first voltage controlled current source, controlled by the output end of the first operational amplifier to provide a first current;
      a first transistor, having a gate coupled to a ground voltage supply, a source coupled to the first voltage controlled current source for receiving the first current, and a drain coupled to a voltage ground;
      a second voltage controlled current source, controlled by the output end of the first operational amplifier to provide a second current;
      a second transistor, having a gate for receiving the microphone signal, a source coupled to the second voltage controlled current source for receiving the second current, and a drain coupled to the voltage ground; wherein:
   the second input end of the first operational amplifier is connected to the drain of the second transistor;
   the source of the first transistor is a first output end for outputting the first preamplified voltage; and
   the source of the second transistor is a second output end for outputting the second preamplified voltage.

6. The audio processing circuit as claimed in claim 5, wherein the preamplifier further comprises:
   a first resistor, coupled between the drain of the first transistor and the voltage ground; and
   a second resistor, coupled between the drain of the second transistor and the voltage ground.

7. The audio processing circuit as claimed in claim 5, wherein the reference voltage is 0.3 volt.

8. The audio processing circuit as claimed in claim 5, wherein the first transistor and the second transistor are P-type Metal-Oxide-Semiconductor field effect transistors (P-MOSFETs).

9. The audio processing circuit as claimed in claim 5, wherein the gain stage comprises:
   a second operational amplifier, having a positive input end coupled to the first preamplified voltage, a negative input end coupled to the second preamplified voltage, a positive power supply end for outputting the first differential output, and a negative power supply end for outputting the second differential output;
   a first capacitor and a third resistor, coupled in parallel between the negative input end and the positive power supply end; and
   a second capacitor and a fourth resistor, coupled in parallel between the positive input end and the negative power supply end.

10. The audio processing circuit as claimed in claim 9, wherein resistances of the third resistor and fourth resistor are at least 10 giga ohm.

11. The audio processing circuit as claimed in claim 9, wherein the gain stage further comprises:
   a third capacitor, coupled between the negative input end and the source of the second transistor; and
   a fourth capacitor, coupled between the positive input end and the source of the first transistor.

* * * * *